United States Patent [19]
Osawa et al.

[11] Patent Number: 5,155,370
[45] Date of Patent: Oct. 13, 1992

[54] DEVICE FOR DETECTING THE RELATIVE POSITION OF FIRST AND SECOND OBJECTS

[75] Inventors: Hiroshi Osawa, Yokohama; Masakazu Matsugu, Atsugi, both of Japan

[73] Assignee: Canon Kabushiki Kaisha, Tokyo, Japan

[21] Appl. No.: 821,134

[22] Filed: Jan. 16, 1992

Related U.S. Application Data

[63] Continuation of Ser. No. 675,060, Mar. 26, 1991, abandoned, which is a continuation of Ser. No. 403,935, Sep. 7, 1989, abandoned.

[30] Foreign Application Priority Data

Sep. 9, 1988 [JP] Japan ............................ 63-225812

[51] Int. Cl.⁵ ............................................ G01N 21/86
[52] U.S. Cl. ...................................... 250/548; 356/401
[58] Field of Search ............... 250/548, 557; 356/400, 356/401; 372/38, 45, 46

[56] References Cited

U.S. PATENT DOCUMENTS

| | | | |
|---|---|---|---|
| 4,037,969 | 7/1977 | Feldman et al. | 356/172 |
| 4,326,805 | 4/1982 | Feldman et al. | 356/399 |
| 4,398,824 | 8/1983 | Feldman et al. | 356/401 |
| 4,458,994 | 7/1984 | Jain et al. | 354/4 |
| 4,514,858 | 4/1985 | Novak | 378/34 |
| 4,539,482 | 9/1985 | Nose | 250/578 |
| 4,545,683 | 10/1985 | Markle | 356/400 |
| 4,667,109 | 5/1987 | Kano | 250/461.1 |
| 4,668,089 | 5/1987 | Oshida et al. | 356/401 |
| 4,704,033 | 11/1987 | Fay et al. | 356/401 |
| 4,785,192 | 11/1988 | Bruning | 250/548 |
| 4,814,596 | 3/1989 | Koizumi et al. | 356/401 |

FOREIGN PATENT DOCUMENTS 157033 12/1981 Japan .
111402 5/1986 Japan .

OTHER PUBLICATIONS

Feldman et al., "Application of Zone Plates to Alignment in X-Ray Lithography," Optical Engineering, vol. 22, No. 2, Mar. 1983, pp. 203–207.

Primary Examiner—David C. Nelms
Attorney, Agent, or Firm—Fitzpatrick, Cella, Harper & Scinto

[57] ABSTRACT

A device, usable in proximity exposure wherein a first object having a pattern and a second object to which the pattern is to be transferred are disposed close to each other, for detecting the relative position of the first and second objects, is disclosed. The device includes a light source for projecting light to the first and second objects; a light detecting system for detecting light from one of the first and second objects illuminated by the light source; and a position detecting system for detecting the relative position of the first and second objects, on the basis of the detection by the light detecting system; wherein the light from the light source has a spectrum whose full width of half maximum is between $\lambda^2/200000$ nm and 60 nm, where $\lambda$ is the wavelength of the light.

36 Claims, 8 Drawing Sheets

DEVICE FOR DETECTING THE RELATIVE POSITION OF FIRST AND SECOND OBJECTS

This application is a continuation of prior application Ser. No. 07/675,060 filed Mar. 26, 1991, which application is a continuation of prior application Ser. No. 07/403,935 filed Sep. 7, 1989, both now abandoned.

FIELD OF THE INVENTION AND RELATED ART

This invention generally relates to a position detecting method and apparatus suitably usable, for example, in a semiconductor microcircuit device manufacturing exposure apparatus of proximity exposure type for lithographically transferring a fine electronic circuit pattern formed on the surface of a first object (original) such as a mask or reticle (hereinafter simply "mask") onto the surface of a second object (workpiece) such as a wafer, for relatively positioning or aligning the mask and the wafer.

In exposure apparatuses for use in the manufacture of semiconductor devices, the relative alignment of a mask and a wafer is one important factor with respect to ensuring improved performance. Particularly, as for alignment systems employed in recent exposure apparatuses, submicron alignment accuracies or more strict accuracies are required in consideration of the demand for a higher degree of integration of semiconductor devices.

In many types of alignment systems, features called "alignment patterns" are provided on a mask and a wafer and, by utilizing positional information obtainable from these patterns, the mask and wafer are aligned. As for the manner of executing the alignment, an example is a method wherein the amount of relative deviation of these alignment patterns is detected on the basis of image processing. Another method is proposed in U.S. Pat. Nos. 4,037,969 and 4,514,858 and Japanese Laid-Open Patent Application, Laid-Open No. Sho 56-157033, wherein so-called zone plates are used as alignment patterns upon which light is projected and wherein the positions of light spots formed on a predetermined plane by lights from the illuminated zone plates are detected.

Generally, an alignment method utilizing a zone plate is relatively insensitive to any defect in an alignment pattern and therefore assures relatively high alignment accuracies, as compared with an alignment method simply using a traditional alignment pattern.

When the physical optic elements such as Fresnel zone plates, for example, are to be used for relative alignment of a mask and a wafer, an He-Ne laser or a semiconductor laser, for example, being highly luminous and having good directivity as well as good coherency can be used as a light source.

However, when light from such a laser is projected on an alignment mark provided on the mask or wafer and signal light from this alignment mark is received by a sensor disposed on a predetermined plane for execution of the alignment, there is a possibility that interference takes place between reflected light from an alignment pattern on the mask and reflected light from an alignment pattern on the wafer or, alternatively, interference is caused by scattered light from the alignment patterns of the mask and the wafer with a result of formation of what can be called speckle on the sensor surface.

Additionally, there is a possibility that alignment signal light interferes with unwanted light such as scattered light, causing optical noise. If such optical noise increases, the signal-to-noise ratio of an output signal from the sensor is reduced, resulting in a decrease in alignment precision.

Particularly, when the spacing between the mask and the wafer is very small, as in the case of a proximity type exposure apparatus, reflection (diffraction) light from the mask and reflection (diffraction) light from the wafer very easily interfere with each other.

SUMMARY OF THE INVENTION

It is accordingly an object of the present invention to provide a position detecting method and apparatus which is particularly suitably applicable to a proximity type exposure apparatus and which is effective to detect the relative position of a mask and a wafer with high precision, without being adversely affected by, for example, interference of reflection (diffraction) light from the mask and the wafer.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

In proximity exposure, if a mask and a wafer are spaced by an interval g=50 microns, there is a difference in optical path length between reflection (diffraction) light from the mask and reflection (diffraction) light from the wafer, which difference is 2g=100 microns. On the other hand, even when a semiconductor laser such as, for example, HL7832G (trade name, available from Kabushiki Kaisha Hitachi Seisakusho, Japan), having a relatively broader spectral bandwidth (i.e. a relatively shorter coherence length) is used, the spectral width is, in terms of half width (full width at half maximum), $\Delta\lambda=2$ nm and the coherence length lc in this case is lc=312 microns. Thus, the coherence length lc is larger than the optical path length 2g and, for this reason, the reflection (diffraction) light from the mask and the reflection (diffraction) light from the wafer are in a mutually coherent relationship. As a result, interference takes place therebetween.

If, to the contrary, a light source of very short coherency (such as a white light source, for example) is used for illumination of a physical optic element such as a Fresnel zone plate, position detecting light convergently projected on a sensor surface by the physical optic element is defocused by chromatic aberration due to the expansion of the spectrum of the light. As a result, the diameter of the light spot on the sensor is not reduced sufficiently and the energy density is low. Therefore, the signal-to-noise ratio is not good.

In consideration thereof, in accordance with the preferred embodiments of the present invention (which will be described later), in proximity exposure the position detection is executed by using light of such coherency by which highest position detecting precision is assured.

Figure 1A:
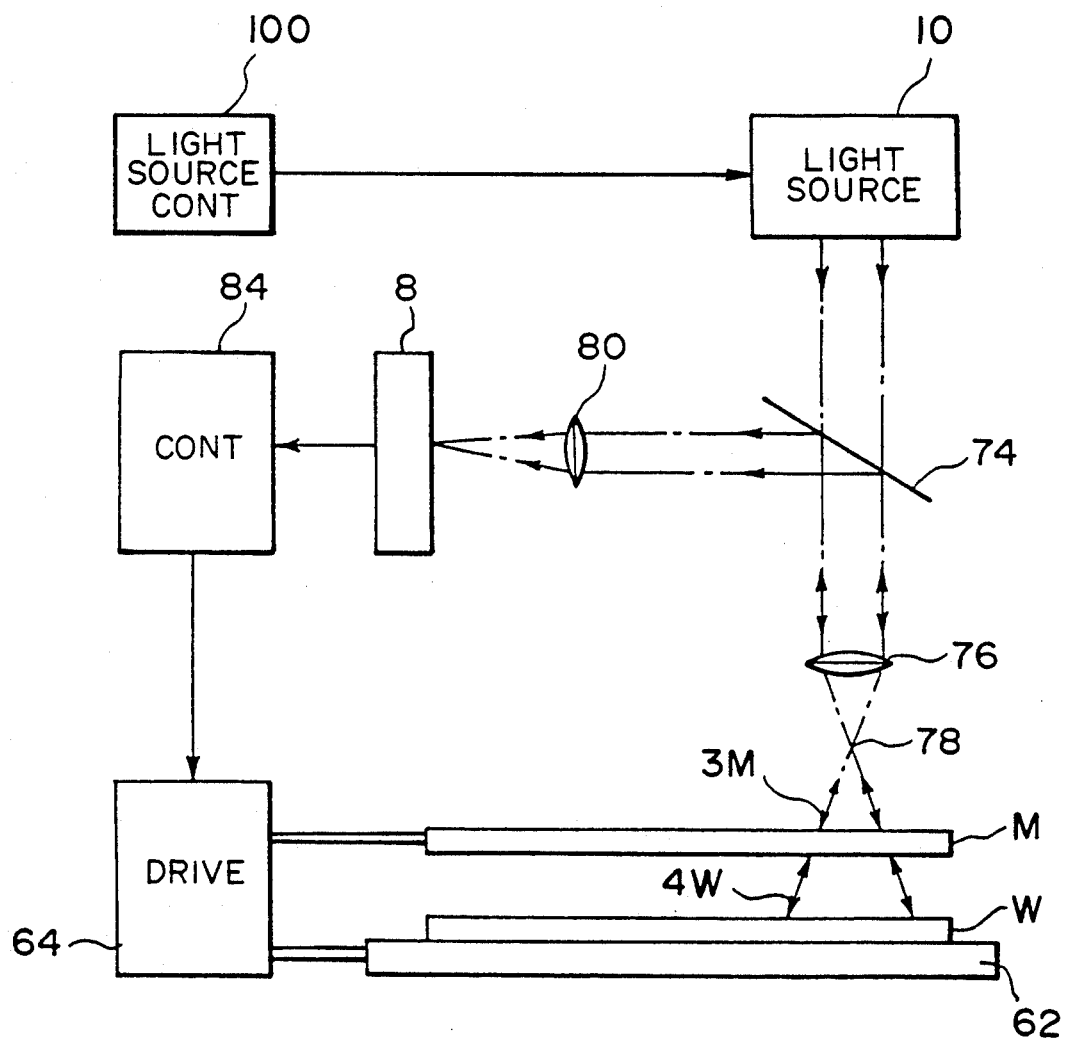
FIG. 1A is a schematic view of a major portion of an alignment system, using zone plates, to which the present invention is applied.

FIG. 1A is a schematic view of an alignment system utilizing zone plates, to which the present invention is applied.

In FIG. 1A, parallel light emanating from a light source 10 passes through a half mirror 74 and is focused at a point 78 by a condensing lens 76. Thereafter, the light illuminates a mask alignment pattern 3M on a mask M and an alignment pattern 4W on a wafer W which is placed on a support table 62. Each of these alignment patterns 3M and 4W is provided by a reflection type zone plate and functions to form a spot of focused light on a plane perpendicular to an optical axis which contains the point 78. The amount of relative deviation of the positions of these light spots formed on that plane is detected, by directing the focused beams to a surface of a detector (sensor) 8 by means of the condensing lens 76 and another lens 80.

In accordance with an output signal from the detector 8, a control circuit 84 actuates a driving mechanism 64 to relatively align the mask M and the wafer W.

Figure 1B:
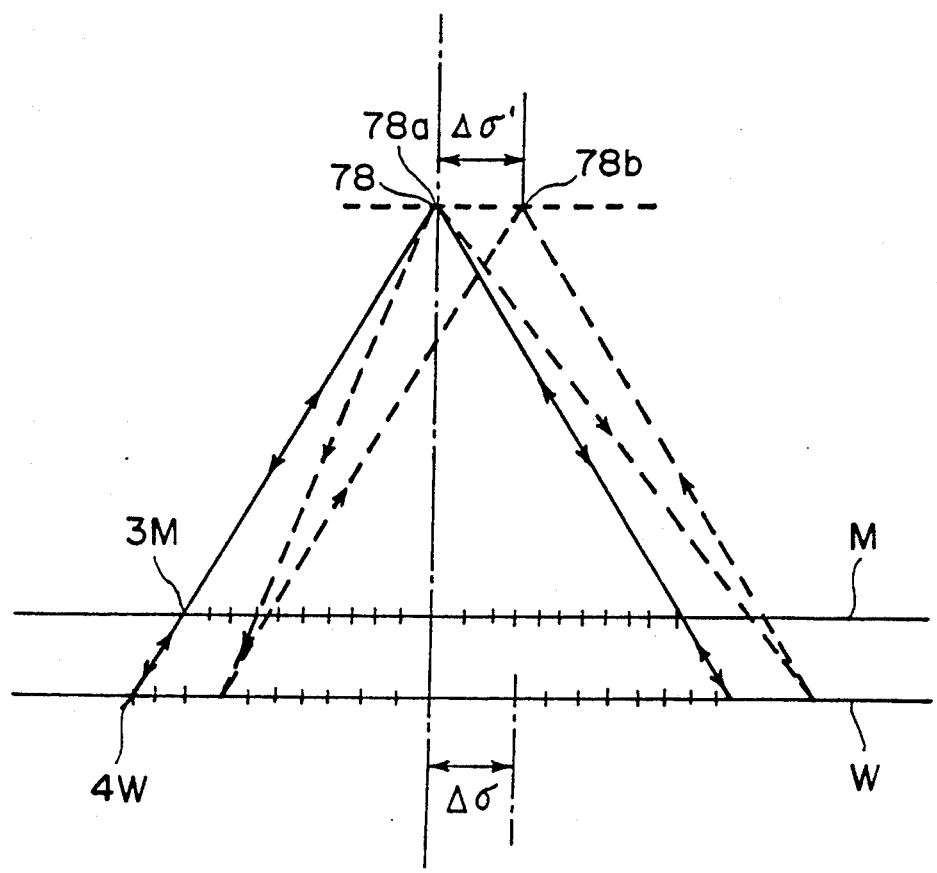
FIG. 1B is a schematic representation of an imaging relationship defined in the optical arrangement of FIG. 1A.

FIG. 1B illustrates an imaging relationship of lights from the mask alignment pattern 3M and the wafer alignment pattern 4W shown in FIG. 1A.

In FIG. 1B, a portion of the light divergently advancing from the point 78 is reflectively diffracted by the mask alignment pattern 3M and forms a spot 78a of focused light at or adjacent to the point 78, the spot representing the mask position. Another portion of the light passes through the mask M in the form of a zero-th order transmission light and is projected upon the wafer alignment pattern 4W on the wafer W surface with its wavefront being unchanged. The incident light is reflectively diffracted by the wafer alignment pattern 4W and then again passes through the mask M in the form of a zero-th order transmission light, and finally, is focused in the neighborhood of the point 78 to form a spot 78b of focused light, representing the wafer position. In the illustrated example, when the light diffracted by the wafer W forms a spot, the mask M merely functions as a transparent member.

The position of the spot 78b formed by the wafer alignment pattern 4W in the described manner represents a deviation $\Delta\sigma'$, in the plane perpendicular to the optical axis containing the point 78, of an amount corresponding to the amount of deviation $\Delta\sigma$ of the wafer W with respect to the mask M.

In the alignment system of this example, for obtaining the relative positional deviation, lights from the zone plates provided on the mask and the wafer, respectively, are imaged independently of each other, on a predetermined plane on which evaluation should be made, and positional errors of these imaging points with respect to a predetermined positional relationship (i.e. the relative position where the mask and the wafer have no relative positional deviation), are measured. Such reference positional relationship can be determined in advance in accordance with design values. However, it may be determined by trial printing.

Next, the light source usable in this embodiment will be explained.

Generally, a laser beam has high coherency. For example, a commercially available He-Ne laser has three or four longitudinal modes and its coherence length is about several tens of centimeters. Also, when a semiconductor laser is actuated to provide a luminous output not less than 1 mW, the coherence length is not less than several hundreds of centimeters. Accordingly, when a laser beam having good coherency is used as a light source in an alignment system of the structure such as that of the present embodiment, reflection light from the mask surface or wafer surface and scattered light from an alignment mark as well as any other unwanted light, other than the alignment signal light, interfere with each other to produce a speckle pattern or interference fringe on the surface of the sensor.

Figure 2:
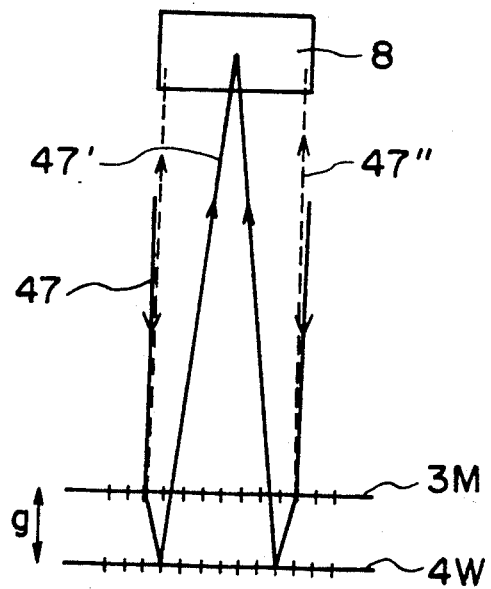
FIG. 2 is a schematic representation, for explaining interference between alignment light and unwanted light.

By way of example, such as shown in FIG. 2, light 47 from a light source, after passing through or reflected by alignment patterns 3M and 4W of a mask M and a wafer W, impinges on a sensor 8 in the form of an alignment signal 47'. However, in addition thereto, reflection (diffraction) light from the surface of the mask alignment pattern 3M impinges on the sensor 8 in the form of unwanted light 47" which interferes with the alignment signal light 47'.

Such interference leads to a decrease in the signal-to-noise ratio of the sensor 8, resulting in a large reduction of the alignment accuracy.

Figure 3A:
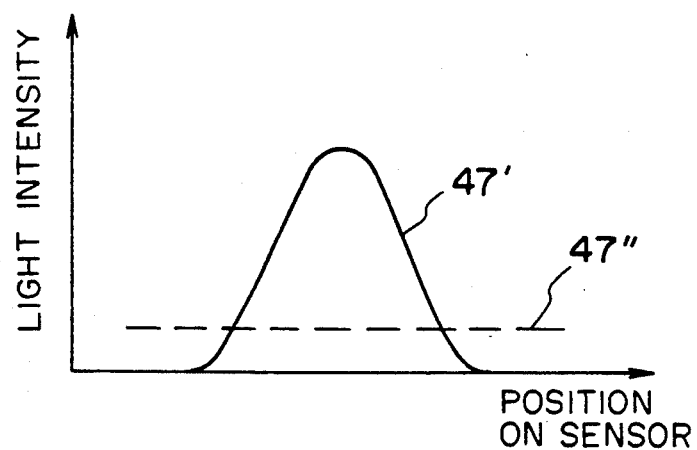
FIGS. 3A-3C are schematic representations, respectively, illustrating light intensity distributions of signal light and unwanted light on a sensor.
Figure 3B:
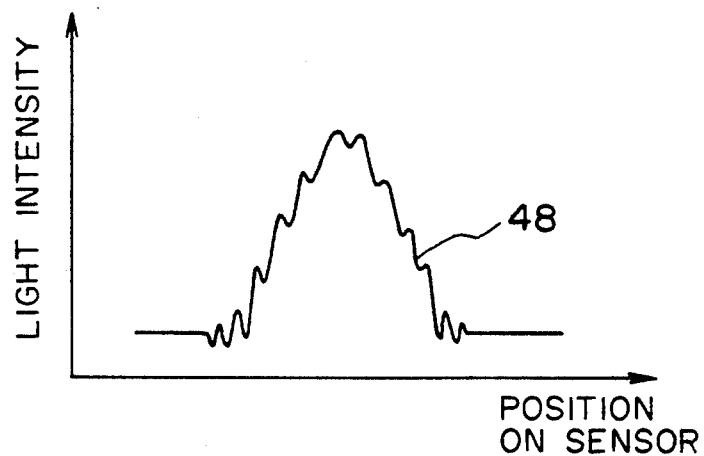
Figure 3C:
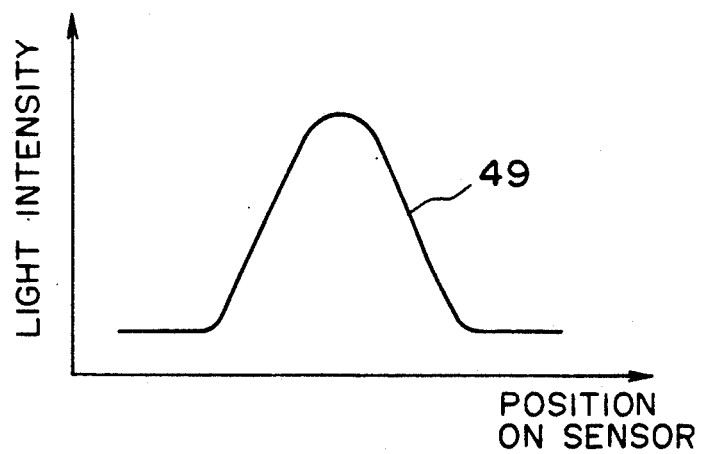

Referring now to FIGS. 3A–3C, the intensity distribution of such an interference pattern to be formed on the surface of a sensor, will now be explained.

When, as shown in FIG. 3A, alignment signal light 47' and unwanted light 47" are superposed, with coherency, one upon another on the surface of the sensor 8, usually the light intensity distribution on the sensor 8 surface has a pattern such as shown in FIG. 3B, containing randomly changing interference light noise.

When the complex amplitude of signal light at a particular point on the sensor is denoted by $A_S \cdot e^{i(\omega t + \phi_1)}$ and the complex amplitude of unwanted light is denoted by $A_N \cdot e^{i(\omega t + \phi_2)}$, then the compound complex amplitude is expressed by:

$$R = A_S \cdot e^{i(\omega t + \phi_1)} + A_N \cdot e^{i(\omega t + \phi_2)}$$
$$= (A_S \cdot e^{i\phi_1} + A_N \cdot e^{i\phi_2}) e^{i\omega t}$$

wherein $A_S$ is the amplitude of the signal light, $A_N$ is the amplitude of the unwanted light, $\omega$ is the frequency of the light, $\phi_1$ is the initial phase of the signal light, and $\phi_2$ is the initial phase of the unwanted light. Here, the intensity of light, namely, the square of the amplitude A is given by:

$$A^2 = (As \cdot e^{i\phi 1} + AN \cdot e^{i\phi 2})(Ase^{-i\phi 1} + ANe^{-i\phi 2})$$
$$= As^2 + AN^2 + As \cdot AN(e^{i(\phi 1-\phi 2)} + e^{i(\phi 2-\phi 1)})$$
$$= As^2 + AN^2 + 2 \cdot As \cdot AN\cos(\phi 2 - \phi 1)$$

In this manner, when the signal light and the unwanted light are combined, there appears, in addition to a strength $As^2$ (responsive only to the signal light) and a strength $AN^2$ (responsive only to the unwanted light), a strength in the third term resulting from the interference effect, that is, the strength $2 \cdot As \cdot AN \cos(\phi2-\phi1)$. This is the case where the signal light and the unwanted light are completely coherent. If the third term is re-written as $2 \cdot As \cdot AN \cos(\phi2-\phi1) \cdot \gamma$ wherein $0 \leq \gamma \leq 1$, and where it is considered that $\gamma = 1$ (when the two lights are completely coherent), $\gamma = 0$ (when they are completely incoherent) and $0 < \gamma < 1$ (when they are partially coherent), then the intensity in a corresponding case can be obtained correctly.

In proximity exposure, usually the spacing g between a mask alignment mark 3M and a wafer alignment mark 4W is in a range of ten to several hundreds of microns and if, in this range, a semiconductor laser is powered at a few mW, the degree of coherency ($\gamma$) is $\gamma \approx 1$. Accordingly, if signal light and unwanted light are superposed one upon another on the surface of a sensor, the intensity of light on that surface is:

$$A^2 = As^2 + AN^2 + 2 \cdot As \cdot AN \cos(\phi2-\phi1) \cdot \gamma$$

wherein $\gamma \approx 1$.

Since $\gamma \approx 1$, the effect of the third term can not be disregarded. By way of example, only with a change in the relative position of the signal light and the unwanted light on an order of $\lambda/2$ (e.g. 0.4 micron), the phase difference $\phi2-\phi1$ between these lights changes by $\pi$ and, therefore, the intensity $A^2$ is randomly changeable between $$A^2 = As^2 + AN^2 - 2 \cdot As \cdot AN$$

and $$A^2 = As^2 + AN^2 + 2 \cdot As \cdot AN$$

In this manner and as illustrated in FIG. 3B, when two or more lights having coherency are superposed one upon another on the sensor 8 surface, the distribution of light intensity on the sensor 8 changes greatly with a small change in the spacing between the mask and the wafer, such as is an amount of 0.1 micron order, under the influence of the interference effect. Therefore, the position detecting precision is degraded considerably.

On the other hand, if $\gamma = 0$, that is when the signal light 47′ and the unwanted light 47″ are completely incoherent, the light intensity distribution on the sensor surface is, as shown in FIG. 3C, the sum of the intensities of the signal light 47′ and the unwanted light 47″ and there is no effect of the interference. If, therefore, the signal light 47′ and the unwanted light 47″ are superposed one upon another on the sensor surface, it is possible to avoid the affect of the unwanted light by electric signal processing. As an example, in FIG. 3A, it is possible to detect a signal output deriving only from the signal light 47′, first by detecting the intensity distribution of the unwanted light 47 and then by subtracting, from a combined signal of the signal light 47′ and the unwanted light 47″, the signal component deriving from the unwanted light 47′.

Next, description will be made of the condition on the spectral width (half width or full width at half maximum) $\Delta\lambda$, for providing the coherency $\gamma = 0$ between the reflection light from the mask and the reflection light from the wafer when they are spaced by a spacing g.

Usually, when light has a coherence length lc, a wavelength $\lambda$ and a spectral width $\Delta\lambda$, then there is a relationship of $lc = \lambda^2/\Delta\lambda$. As an example, a semiconductor laser HL7832G was actuated with a power not more than a threshold and, when the spectral width $\Delta\lambda = 16$ nm and the center wavelength $\lambda = 0.79$ micron, then the coherence length lc was 40 microns as measured by an optical spectrum analyzer "TQ8345" (manufactured by Kabushiki Kaisha Advantest, Japan). This has a good correspondence to a theoretical value of $\lambda^2/\Delta\lambda = 39$ microns. In the following part of this specification, the theoretical equation $lc = \lambda^2/\Delta\lambda$ will be used.

Since $lc = \lambda^2/\Delta\lambda$, $\Delta\lambda = \lambda^2/lc$. On the other hand, the condition under which the reflection lights from the mask and the wafer do not interfere with each other, is $lc \leq 2g$. It follows therefrom that the condition necessary for the spectral width, for preventing interference when a mask-to-wafer spacing g is given, is $\Delta\lambda \geq \lambda^2/2g$. From this, it is seen that, with a broader spectral width and a shorter wavelength, the prevention of interference is better.

For a proximity exposure apparatus, usually it is necessary to avoid the interference even when the mask-to-wafer spacing is not more than 100 microns. Since $\Delta\lambda \geq \lambda^2/2g$, the condition for preventing the interference, for a spacing of 100 microns, can be given by:

$$\Delta\lambda \geq \lambda^2/200000 \qquad (1)$$

wherein the unit of $\Delta\lambda$ and $\lambda$ is nanometer.

If on the other hand the spectral width of a light source is broadened to reduce the coherent length, the signal spot on the sensor surface becomes large, since the physical optic element has a wavelength dependence. Also, since the quantity of light incident on the sensor is fixed, the peak value of the signal decreases. Because the noise level does not change, if the spectral width of the light source is broadened beyond a predetermined limit, the signal-to-noise ratio decreases and, as a result, sufficient precision with regard to the position detection is no longer obtainable.

In different types of position detecting devices all using a physical optic element such as a zone plate, depending on the detection method adopted, there is a difference with respect to the output of a light source, the diffraction efficiency of a physical optic element, and the like. However, provided that the system uses physical optic element means for the position detection purpose and it detects a spot for this purpose, there is a problem of reduction in the signal-to-noise ratio due to expansion of a focused light spot, resulting from the wavelength dependence of the physical optic element means, where the spectral width of the light source is broadened.

This will be discussed in greater detail, by reference to FIG. 4 wherein the arrangement shown in FIG. 1A is used.

Figure 4:
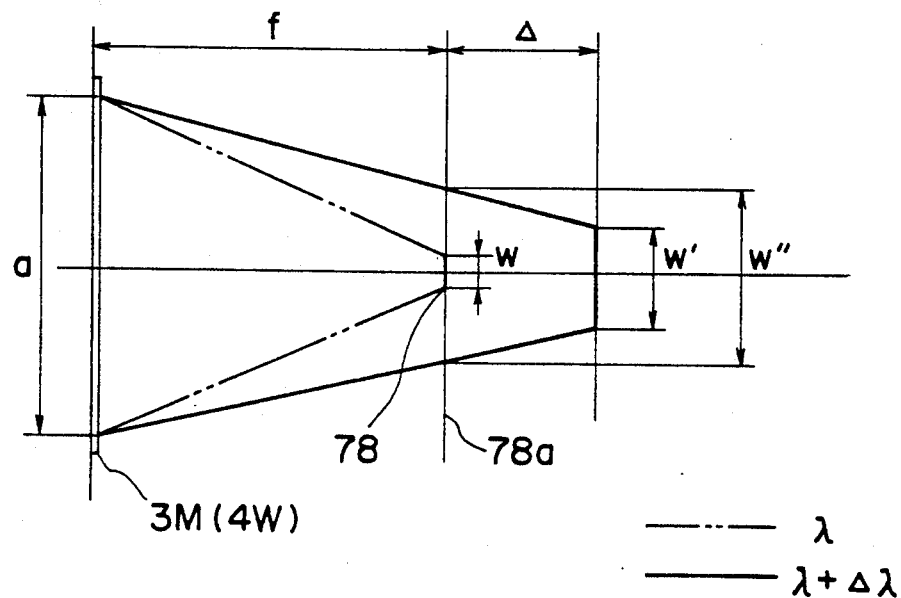
FIG. 4 is a schematic representation, for explaining formation of a spot.

Denoted in FIG. 4 at 3M (4W) is a physical optic element which is provided on a mask (or wafer). Denoted at 78 is an imaging point of a signal light spot, which point is on a plane 78a which is optically conjugate with the sensor surface position. Character a denotes the size of the physical optic element, and character w denotes the diameter of a spot to be formed where the light source has no spectral expansion. Character w' denotes the diameter of a spot at an imaging position, to be formed where the light source has a spectral expansion $\Delta\lambda$, and w'' denotes the diameter of a spot at the position 78a, conjugate with the sensor surface, to be formed where the light source has a spectral expansion $\Delta\lambda$. Character $\Delta$ denotes the amount of change in the focal length of the physical optic element 3M, resulting from a change $\Delta\lambda$ in the wavelength.

In FIG. 4, where the wavelength of the light source is denoted by $\lambda$, the spot diameter w at the position 78a, conjugate with the sensor surface, formed when the light source has no spectral expansion, can be expressed by:

$$w = 1.4\lambda f/a$$

wherein f is the focal length of the physical optic element 3M (4W) with respect to the wavelength $\lambda$. If on the other hand the light source has spectral expansion of $\Delta\lambda$ and when the wavelength changes from $\lambda$ to $\lambda + \Delta\lambda/2$, then the focal length of the physical optic element 3M changes to $f(1+\Delta\lambda/2\lambda)$. As a result, the spot position shifts from the sensor position 78 by $\Delta = \Delta\lambda/2\lambda \times f$, and the spot diameter w' in this case is:

$$w' = 1.4\lambda f(1+\Delta\lambda/2\lambda)/a$$

If the spot diameter at the position 78a conjugate with the sensor surface is denoted by w'', then $$(w''-w')/(a-w') = \Delta/(f+\Delta)$$

From this, it follows that $$w'' = \Delta/(f+\Delta) \times (a-w') + w'$$

The diameter w'' of the spot of light of a wavelength $\lambda + \Delta\lambda/2$, is approximately equal to the diameter of the spot of light having a spectral width $\Delta\lambda$.

If the spectral width of the light source is broadened by $\Delta\lambda$, the amount of change in the spot diameter at the position 78a conjugate with the sensor surface, can be expressed as follows:

$$\begin{aligned} w''/w &= 1/[\lambda + (\Delta\lambda/2)] \times (\lambda + a/w \times \Delta\lambda/2) \\ &= (a^2 \times \Delta\lambda/2 + 1.4\lambda^2 f)/[1.4\lambda f(\lambda + \Delta\lambda/2)] \\ &= (a^2 \times \Delta\lambda/2)/[1.4\lambda f(\lambda + \Delta\lambda/2)] + \lambda/(\lambda + \Delta\lambda/2) \end{aligned}$$

Assuming now that the total quantity of the signal light on the sensor surface as established when the light source has spectral expansion is the same as that as established when the light source has no spectral expansion, then, as a result of enlargement of the spot diameter from w to w'', the peak value of the signal output is magnified with a magnification w/w', in inverse proportion to the enlargement of the spot diameter. In other words, the energy density of the signal light on the sensor surface reduces and the signal-to-noise ratio decreases. Thus, sufficient precision is not attainable.

Next, description will be made of an upper limit of the spectral width necessary for obtaining sufficient precision, while taking into account the decrease in the signal-to-noise ratio due to expansion of the spectral width.

Referring back to FIG. 1A, for projection with enlargement of a spot on the sensor through the lenses 76 and 80 and for discrimination of the position thereof, the spot which can be formed by the physical optic element 3M (4M) should preferably be small to some extent. More particularly, while as discussed in the foregoing, the spot diameter is determined by $1.4\lambda f/a$, it is preferably not more than 10 microns. On the other hand, with respect to the manufacture of a physical optic element such as a Fresnel zone plate, for example, a longer focal length will be advantageous, because, with a larger focal length f, the pattern pitch can be larger. However, in consideration of the above-discussed condition, normally the focal length f of the physical optic element will be not more than 1 mm. As for a light source, particularly an optical semiconductor device such as a semiconductor laser or SLD, the most practical wavelength region will be around 0.8 micron. Further, in consideration of the limitation that the area on a wafer which can be occupied by an alignment mark is restricted, the size a of the physical optic element will be practically on an order of 100 microns.

Assuming, as a practical example, that in the FIG. 1A arrangement $f = 1$ mm, $\lambda = 0.85$ micron and the spectral width $\Delta\lambda = \pm 30$ nm, then the rate w''/w of expansion of the spot diameter in the case of $\Delta\lambda = \pm 30$ nm as compared with a case where there is no expansion of the spectral width, is about 1.25. From this it is seen that, if the spectral width is broadened by about $\pm 30$ nm, the peak value of the signal light on the sensor is reduced by about 20%. Therefore, the signal-to-noise ratio decreases, resulting in a difficulty in obtaining sufficient position detection precision.

Accordingly, in the position detection system such as shown in FIG. 1A, usually the spectral width of the light source is preferably not more than 60 nm. That is, the relationship:

$$\Delta\lambda \leq 60 \text{ (nm)} \tag{2}$$

should be satisfied. From equations (1) and (2), it is seen that, in the position detecting process in proximity exposure wherein a spot is formed by single convergence through a physical optic element, the relationship:

$$\lambda^2/200000 \leq \Delta\lambda \leq 60 \text{ (unit: nm)}$$

defines a suitable range which is effective to reduce the influence of interference light and degradation of the signal-to-noise ratio due to the spot expansion.

Next, description will be made of an embodiment which is arranged so that a light source 10 is controlled by a light source drive control means 100 in the manner that the wavelength range of the light from the light source 10 approaches the above-described range, to thereby reduce the coherency of the light and to reduce the influence of interference light produced on the sensor surface as well as degradation of the signal-to-noise ratio.

As an example, when a laser is used as a light source, in this embodiment the laser is driven by a driving electric current not higher than 1.1 times larger than a threshold electric current Ith for the drive of that laser, and in this manner the influence of the interference light on the sensor surface is reduced.

Figure 5A:
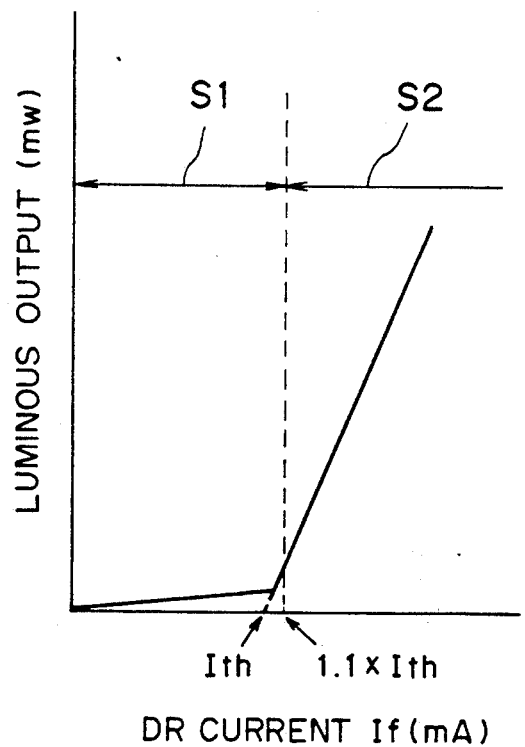
FIG. 5A is a graph for explaining an electric current for energizing a laser.

FIG. 5A is a schematic representation, illustrating a driving range of a drive current in a case where in this embodiment a semiconductor laser is used. In this Figure, a region S1 and a region S2 are partitioned at a point at which the drive current becomes equal to $1.1 \times \text{Ith}$ wherein Ith is the threshold electric current for the laser. Usually, the region S1 is a region of low coherency, while the region S2 is a region of higher coherency, as compared with the region S1.

In this embodiment, as described, the laser is driven by a drive current not more than $1.1 \times \text{Ith}$, within the region S1, so that the coherency is reduced.

Figure 5B:
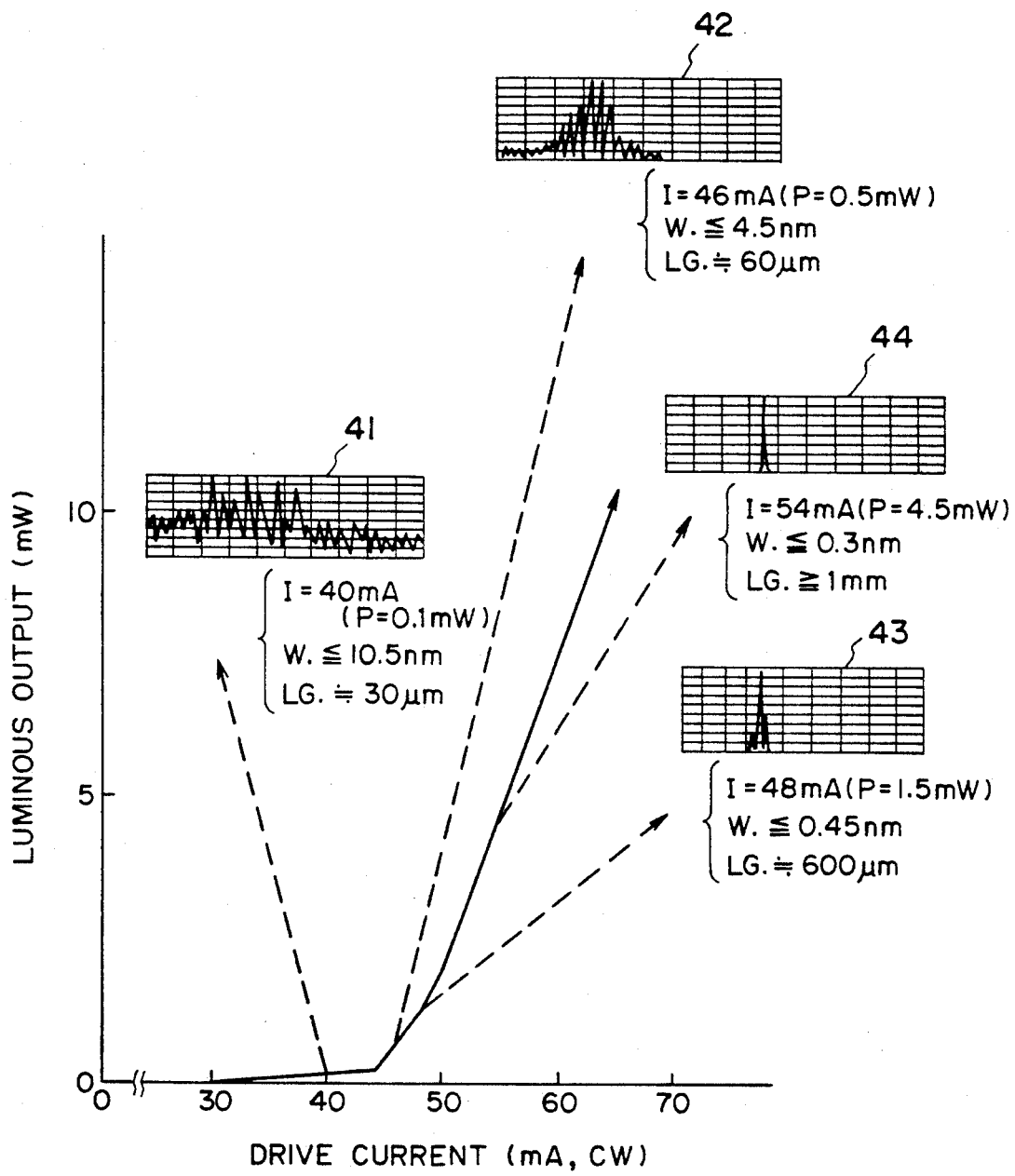
FIG. 5B is a schematic representation, for explaining the characteristics of a semiconductor laser.

FIG. 5B is a schematic representation of an embodiment of the present invention, illustrating emission characteristics of a semiconductor laser "HL8314G" (trade name; manufactured by Kabushiki Kaisha Hitachi Seisakusho, Japan) which is used as a light source in this embodiment.

In FIG. 5B, the axis of the abscissa denotes the electric current to be applied to the semiconductor laser, while the axis of the ordinate denotes the luminous output corresponding to the applied electric current. The luminous output of the semiconductor laser, as it goes beyond the threshold electric current Ith (about 46 mA), increases quickly. As illustrated, the threshold electric current Ith for the semiconductor laser HL8314G is about 46 mA. Also, only for reference, in FIG. 5B, there are illustrated at 41, 42, 43 and 44 examples of spectral distribution of an emitted wavelength in the cases where the drive current I is I=40 mA, I=46 mA, I=48 mA and I=54 mA, respectively.

Although up to the neighborhood of the threshold current Ith, the spectral distribution of the semiconductor laser beam in the illustrated example shows a multiple-mode, if an electric current on an order of I=54 mA ($\approx 1.2 \times \text{Ith}$) (optical output is 4.5 mW) is applied to the laser, a single-mode laser such as the laser HL8314G oscillates in the single mode. In the case of the laser HL8314G, it is in the multiple-mode oscillation up to $I = 1.1 \times \text{Ith}$. The coherence length was measured by using an optical spectrum analyzer "TQ8345", available from Kabushiki Kaisha Advandest, Japan. The result is that: it was about 60 microns in the spectrum graph 41 (spectral width = 10.5 nm) when I=40 mA; it was about 120 microns in the spectrum graph 42 (spectral width = 4.5 nm) when I=46 mA; it was about 1200 microns in the spectrum graph 43 (spectral width = 0.45 nm) when I=48 mA; and it was about 1 mm in the spectrum graph 44 (spectral width = not more than 0.3 nm) when I=54 mA. As regards the luminous output, it was about 0.1 mW in the graph 41 when I=40 mA; and it was about 0.5 mW in the graph 42 when I=46 mA. Further, with regard to the full angle of half maximum of FFP (Far Field Pattern), where I is not less than 40 mA, $\theta_n = 30°$ and $\theta_L = 20°$, and it was constant.

In the present embodiment, as described, a semiconductor laser which oscillates in a single mode with a current higher than a threshold current, is driven with a current not greater than the threshold current. By this, a light being highly luminous, low in coherency and high in signal-to-noise ratio, wherein the spectrum is in the multiple-mode while the directivity of the FFP is retained, is obtained.

Also, as a light source, in the present invention it is possible to use a super luminescent diode (SLD), which may be called "super radiant diode"

Figure 6A:
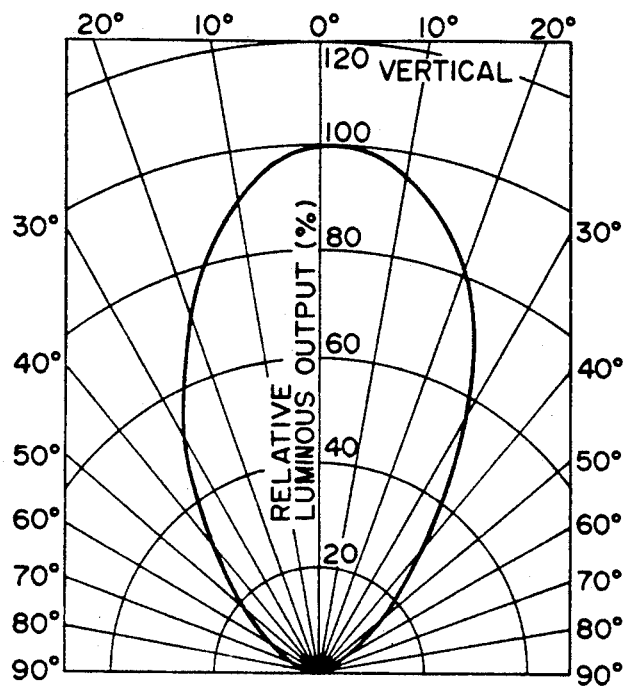
FIGS. 6A-6D are schematic representations, for explaining the characteristics of a superluminescent diode.
Figure 6B:
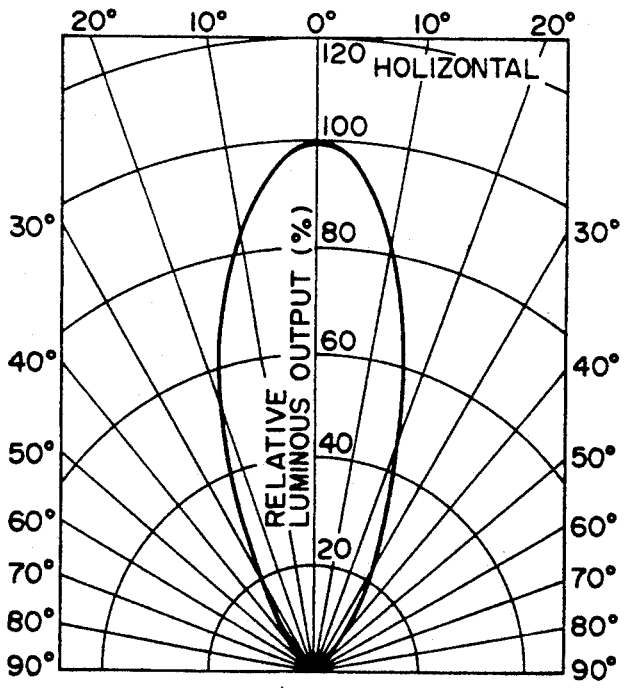
Figure 6C:
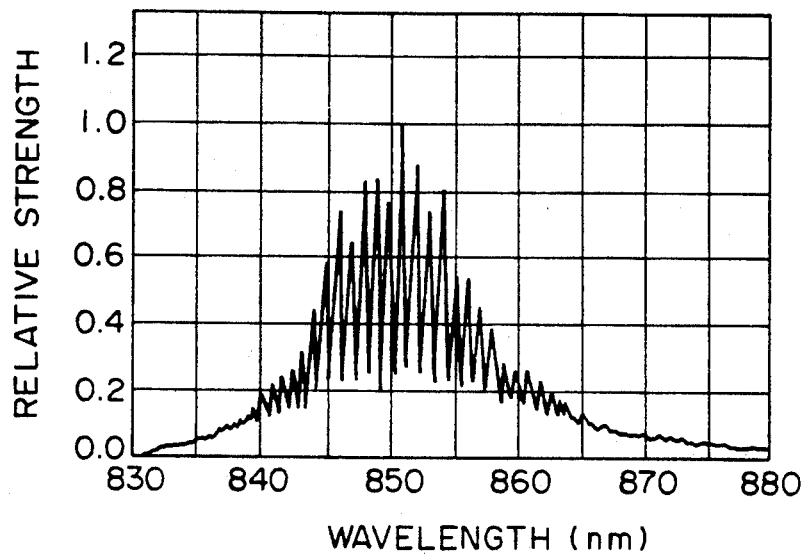
Figure 6D:
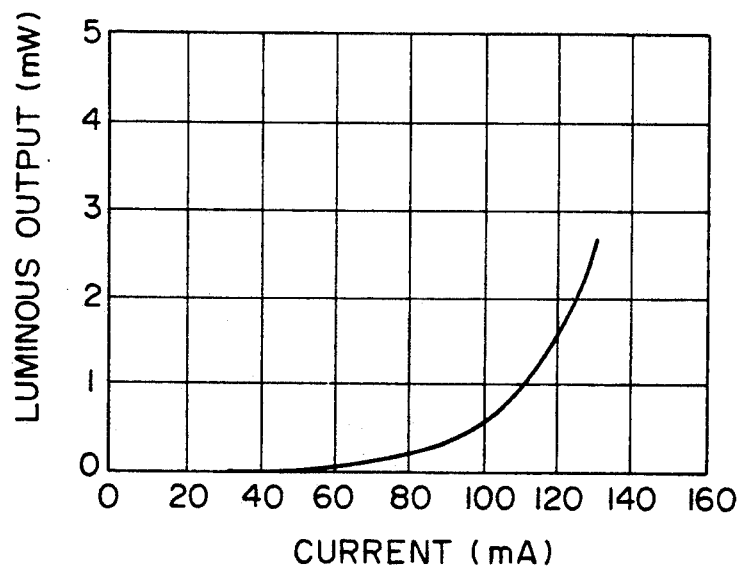

FIGS. 6A and 6B show the directivity characteristics of a radiation beam from an SLD "L330Z" (trade name, manufactured by Hamamatsu Photonics, Japan), in the directions perpendicular to and parallel to an active layer surface, respectively. FIG. 6C shows an emitted spectral distribution where an electric current I=120 mA is applied to the SLD, and FIG. 6D shows the current vs. luminous output characteristics of the SLD.

An SLD has a good light directivity as compared with an ordinary light emitting diode and, irrespective of its highly luminous output, the emitted spectral width is wide and the coherency is relatively low. Therefore, it is suitable as a light source in an alignment system according to the present invention.

The full width of half maximum of the spectral width shown in FIG. 6C is about 10 nm, and this has a coherency corresponding to the spectral width of the semiconductor laser of the foregoing embodiment in an occasion where I=40 mA. The coherence length on this example is about 60 microns and, when a mask and a wafer are set with a spacing not less than 30 microns, it is possible to satisfactorily prevent degradation of the signal-to-noise ratio of the position detection signal due to the interference between the position detection signal light and the unwanted light.

Also, if an electric current on an order of I=130 mA is applied, a light output of substantially the same spectral width and not less than 2 mW is obtainable. Further, it is possible to make the size of the light emitting portion of the SLD to a small area not more than $6 \times 2$ (micron). Therefore, in addition to the good directivity of an emitted light, there is an advantage that it can be used as a light source having high luminance and low coherency.

Figure 7:
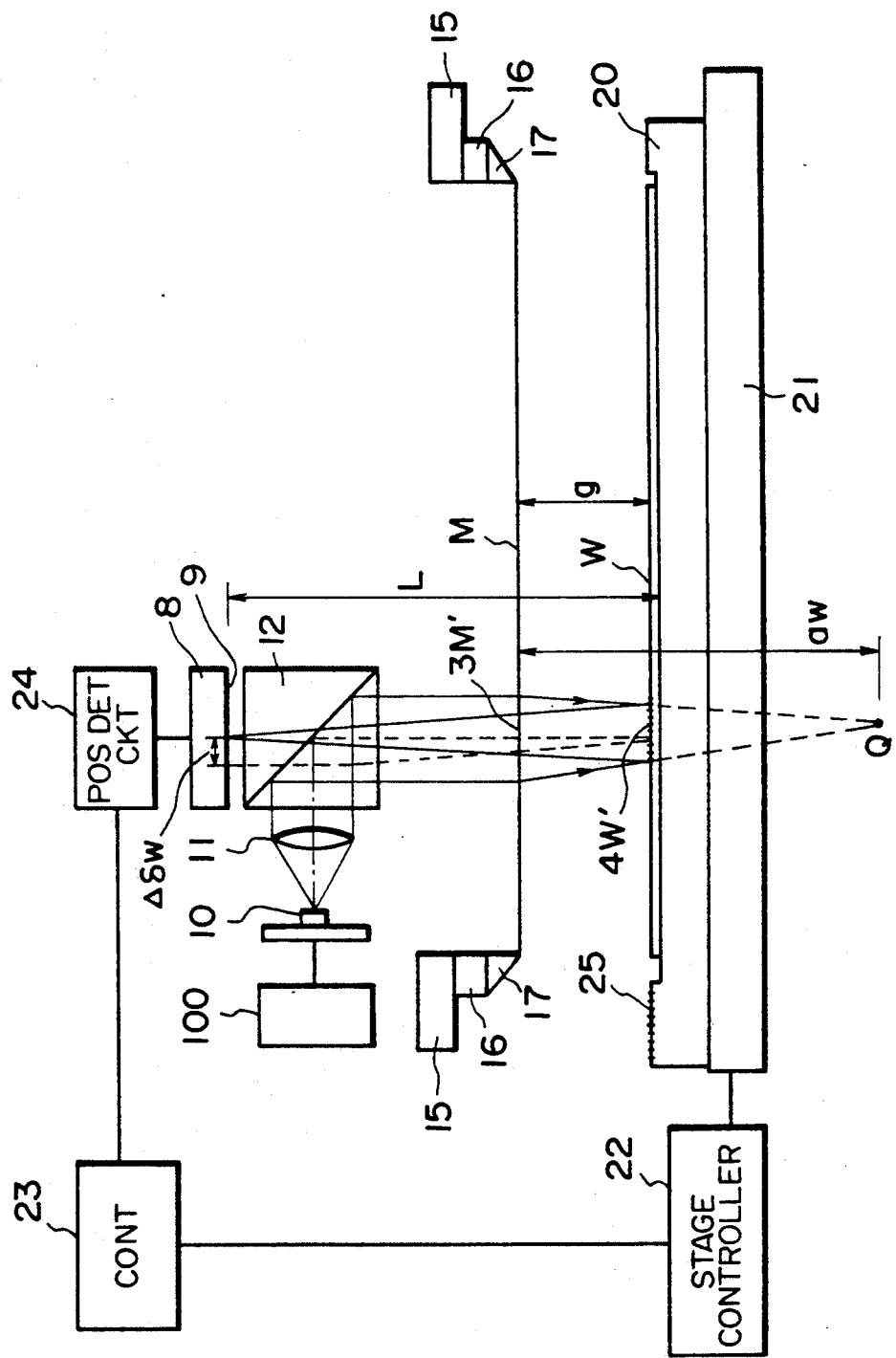
FIG. 7 is a schematic view of a major portion of an alignment system to which the present invention is applied.

FIG. 7 is a schematic view of a major part of another embodiment, wherein the invention is applied to a proximity type exposure apparatus for the manufacture of semiconductor devices.

Denoted in this Figure at M is a mask and at W is a wafer, which correspond to first and second objects, respectively, to be relatively aligned with each other. Denoted at 3M' is a mask alignment pattern (first physical optic element) provided on the mask M surface. Denoted at 4W' is a wafer alignment pattern (second physical optic element of reflection type) provided on the wafer 4 surface.

In this embodiment, the alignment patterns 3M' and 4W' are formed by physical optic elements having a light converging function and a light diverging function, respectively, so that they provide an alignment system of what can be called "convex-concave system" type. In FIG. 7, light emanating from a variable wavelength range type light source 10 is collimated by a projecting lens system 11 into parallel light, and after passing a half mirror 12, the parallel light illuminates the mask alignment pattern 3M'. The mask alignment pattern 3M' comprises, in this embodiment, a zone plate operable to collect the received light at a point Q which is below the wafer W. The light convergently advancing toward the point Q impinges on the wafer alignment pattern 4W', before it reaches the point Q.

The wafer alignment pattern 4W' comprises, in this embodiment, a zone plate of reflection type, and serves to reflect the received light and to collect the same on a detection surface 9 of a detector 8, after passage through the mask M and the half mirror 12.

By using a position detecting circuit 24, the position of the center of gravity of the formed spot of focused light is detected, and the thus obtained position signal is supplied to a control device 23.

Here, the term "center of gravity of light" means such a point that, when in the detection surface a position vector of each point in the detection surface is multiplied by the light intensity of that point and the thus obtained products are integrated over the entire detection surface, the integrated value has a "zero vector".

The control device 23 evaluates the positional deviation of the wafer and supplies an alignment signal to a wafer stage controller 22. By this wafer stage controller 22, the wafer stage 21 is moved to correct the positional deviation between the mask and the wafer. Denoted at 100 is a light source drive control means which, as will be described later, is operable to control the wavelength range of light emanating from the light source 10. Denoted at 15 is a frame of the aligner; at 16 is a mask chuck; at 17 is a membrane; and at 20 is a wafer chuck.

If in this structure a relative and lateral deviation $\Delta\delta$ takes place between the mask M and the wafer W, the angle of emission of the light having been influenced by the lens functions (converging functions) of the mask alignment pattern 3M' and the wafer alignment pattern 4W', changes and, as a result, the center of gravity of the spot of focused light on the detection surface 9 displaces. Assuming now that the angle of emission is small and the mask M and the wafer W are relatively deviated by $\Delta\sigma w$ in a direction parallel thereto, where aw denotes the focal length of the mask alignment mark and L denotes the distance to the point of convergence of the light passed through and converged by the wafer alignment mark 4W, then the displacement $\Delta\delta w$ of the center of gravity of the spot of focused light on the detection surface 9 can be expressed by:

$$\Delta\delta w = \Delta\sigma w[1 - L/(aw - g)] \quad (3)$$

If, for example, the spacing g between the mask M and the wafer W is g=30 microns so that
aw=214.7228 microns
L=18657 microns
then, a sensitivity of "x−100" is obtainable.

Namely, the present embodiment has an advantageous feature that, if the displacement $\Delta\delta w$ can be measured at a precision of 1.0 micron, it is possible to evaluate the positional deviation $\Delta\sigma w$ with a resolution of 0.01 micron. The focal length bw on that occasion is −186.570 micron.

Practically, the relative positional deviation between the mask and the wafer can be detected in the following manner:

First, at the time of initially setting the mask, a reference position is determined. For this reference position, the position of the center of gravity of light where the mask and the wafer have no relative positional deviation, may be used. Such reference position can be determined by trial printing, for example. Then, in actual position detecting operation, any error in the position of the center of gravity, in the X direction, with respect to the reference position is measured and, from the measured value and in accordance with equation (1), the relative positional deviation between the mask and the wafer is determined. In the present embodiment, as described, a single spot of focused light is formed by two physical optic elements provided on the mask and the wafer, respectively.

Also, in this embodiment, the light source drive control means 100 controls the light source 10 so as to ensure that the wavelength range of the light from the light source 10 approaches a range effective to reduce the degradation of signal-to-noise ratio due to the influence of interference or expansion of spot diameter. As for the light source 10, a semiconductor laser or SLD, for example, described hereinbefore, can be used. More specifically, the light source drive control means 100 executes the light source control as will be described below, to provide a desired spectral width.

In the position detecting system such as shown in FIG. 7, the spectral width which can be admitted for attaining sufficient position detection precision, may be determined in the following manner:

The permissible decrease in the energy density of signal light on the sensor, as described, is at a point whereat the signal level reduces by 20% from the peak value. In FIG. 7, it is now assumed that the mask and the wafer have focal lengths aw=214.7228 microns and bw=−186.570 microns, like the foregoing numerical example, the mask-to-wafer gap is $\delta$=30 microns, the distance between the wafer and the sensor is L=18657 microns, and the wavelength of used light is 0.85 micron, like that of an ordinary SLD or otherwise.

The full spectral width is 40 nm and the half width is 20 nm, and in the later part of this Specification calculations will be made under a condition of $\Delta\lambda/2$=20 nm. When a Fresnel zone plate has a focal length f and if there occurs a change in wavelength by $\Delta\lambda$, the changed focal length f can be expressed by:

$$f = [1 + (\Delta\lambda/2)/\lambda]f$$

Substituting aw=214.7228 (micron), bw=−182.9118 (micron), $\Delta\lambda/2$=21 (nm) and $\lambda$=0.85 (micron) into this equation, then aw=209.6705 (micron) and bw=−178.6080 (micron). Since $$1/(aw - \delta) + 1/L = -1/bw$$

so the geometo-optically imaging point is at a distance 30202.9 microns. Since, at this time, the sensor retains the value 18657 microns, described above, if the diameter (size) of an exit window of the Fresnel zone plate of the wafer with respect to the alignment direction is denoted by a, the spot on the sensor has a value 0.3823a. Therefore, if a=100 microns, then the value of 0.3823a is equal to 38 microns. If $\lambda$=0.85 micron, then the wave-optical spot diameter is 1.4$\lambda$F (F is the F number and F=f/a). Therefore, $$1.4 \times 0.85 \times 18657/100 = 222 \text{ (micron)}$$

From the sum of 222 microns and 38 microns, the change is in an amount about 260 microns. Namely, expansion of 17% takes place. Since the decrease of the peak value is in inverse proportion to the expansion of the spot diameter, this means that the peak value decreases by about 15%.

In other words, when the spectral width=±20 nm, the peak value decreases by about 15%. By extrapolation of this numerical example, it is seen that the decrease of the peak value by about 20% takes place when the spectral width (half width) is equal to ±30 nm. Namely, when the spectral width is ±30 nm, the peak value decreases to about 80%, and the signal level necessary for obtaining a sufficient signal-to-noise ratio with regard to the signal detection, can be attained.

If the spectral width is larger, the peak value will be reduced to not more than 80% and, in consideration of a possible low diffraction efficiency of the alignment light or a possibility of mixture of scattered light of a large amount (resulting in low signal-to-noise ratio), it will be difficult to retain sufficient precision.

For the reason set forth above, it is preferable that the spectral half width of the light source is not more than ±30 nm. Accordingly, the relationship:

$$\Delta\lambda \leqq 60 \text{ (nm)} \quad (4)$$

is the condition for sufficiently reducing the degradation of the signal-to-noise ratio due to the spot diameter expansion. The condition for sufficiently reducing the influence of the interference is the same as that of the FIG. 1A embodiment, and it is given by equation (1). Therefore, from equations (1) and (4), $$\lambda^2/200000 \leqq \Delta\lambda \leqq 600 \text{ (unit: nm)}$$

is the condition to be satisfied in this type of apparatus.

It is to be noted that, although in the present embodiment it is possible to use a low coherency light source such as a xenon lamp or a white light lamp, for example, having a broad spectral width, usually such a light source is low and quite large in size of the light source area, as compared with a semiconductor device (e.g. several tens of microns). Further, there may be a problem that the spectral width is too large and the spot diameter cannot be made sufficiently small. In consideration of this, in the present embodiment an SLD or the like is used as a light source and the coherency of the light is reduced in the manner described hereinbefore. By this, high-precision alignment system is attained.

While the invention has been described with reference to the structures disclosed herein, it is not confined to the details set forth and this application is intended to cover such modifications or changes as may come within the purposes of the improvements or the scope of the following claims.

What is claimed is:

1. A device, usable in proximity lithography exposure wherein a first object having a pattern and a second object to which the pattern is to be transferred are disposed close to each other, for detecting the relative position of the first and second objects, said device comprising:
   light source means for projecting light to illuminate the first and second objects;
   light detecting means for detecting light from one of the first and second objects illuminated by said light source means; and
   position detecting means for detecting the relative position of the first and second objects, on the basis of the detection by said light detecting means;
   wherein the light from said light source means with which the first and second objects are illuminated has a spectrum whose full width of half maximum is between $\lambda^2/200000$ nm and 60 nm, where $\lambda$ is the wavelength of the light.

2. A device according to claim 1, wherein said light source means comprises a laser and wherein said device further comprises light source drive control means for controlling a drive current applied to said laser to control the half width of the spectrum of the projected light to a range between $\lambda^2/200000$ nm and 60 nm.

3. A device according to claim 1, wherein said light source means comprises a super luminescent diode.

4. A device, usable in proximity lithography exposure wherein a first object having a pattern and a second object to which the pattern is to be transferred are disposed close to each other, for detecting the relative position of the first and second objects, said device comprising:
   light source means comprising a super luminescent diode for projecting light to illuminate the first and second objects;
   light detecting means for detecting light from one of the first and second objects illuminated by said light source means; and
   position detecting means for detecting the relative position of the first and second objects, on the basis of the detection by said light detecting means;
   wherein said super luminescent diode produces light of such a wavelength effective to reduce coherency of the light detected by said light detecting means.

5. A device, usable in proximity lithography exposure wherein a first object having a pattern and a second object to which the pattern is to be transferred are disposed close to each other, for detecting the relative position of the first and second objects, said device comprising:
   light source means for projecting light to illuminate the first and second objects;
   light detecting means for detecting light from one of the first and second objects, illuminated by said light source means; and
   position detecting means for detecting the relative position of the first and second objects, on the basis of the detection by said light detecting means;
   wherein the light source means comprises a single mode laser and drive control means for controlling a drive current applied to said laser for maintaining the drive current no greater than a threshold for initiation of single mode laser emission.

6. A method of optically detecting a position of a substrate having a mark formed thereof, said method comprising the steps of:
   directing a radiation beam from a super-luminescent diode to the substrate; and
   detecting a light image formed by the radiation beam from the substrate and corresponding to the position of the mark of the substrate.

7. A method according to claim 6, wherein the mark comprises a zone plate.

8. A method of optically detecting a position of a substrate having a mark formed thereon, said method comprising the steps of:
   directing a multi-mode laser beam to the substrate; and
   detecting a light image formed by the laser beam from the substrate and corresponding to the position of the mark of the substrate.

9. A method according to claim 8, wherein the mark comprises a zone plate.

10. A method according to claim 8, wherein said directing step comprises driving a single-mode semiconductor laser with a predetermined drive current to cause multi-mode oscillation.

11. In a method usable with a first substrate having a first mark and a second substrate having a second mark and being spaced from the first substrate by a predetermined gap, for detecting a positional relationship between the first and second substrates by using the first and second marks, the improvement comprising the steps of:

irradiating the first and second substrates with light having a spectral half width in a range of $\lambda^2/200{,}000$ nm to 60 nm, where $\lambda$ is a center wavelength of the light; and detecting first and second light images corresponding to the positions of the first and second marks being formed by light beams reflected from the irradiated first and second substrate, respectively.

12. A method according to claim 11, wherein the first and second marks each comprise a zone plate.

13. A method according to claim 12, further comprising supplying the irradiating light from a super-luminescent diode.

14. A method according to claim 12, further comprising supplying the irradiating light from a multi-mode oscillation laser.

15. In a method usable with a first substrate having a first zone plate and a second substrate having a second zone plate and being spaced from the first substrate by a predetermined gap, for detecting a positional deviation between the first and second substrates by using the first and second zone plates, the improvement comprising the steps of:

irradiating the second substrates through the first substrate, with light having a spectral half width in a range of $\lambda^2/200{,}000$ nm to 60 nm, where $\lambda$ is a center wavelength of the light; and detecting a light image corresponding to the positional deviation between the first and second substrates being formed by light reflectively and transmissively modulated by the second and first substrates, respectively.

16. A method according to claim 15, further comprising supplying the irradiating light from a super-luminescent diode.

17. A method according to claim 15, further comprising supplying the irradiating light from a multi-mode oscillation laser.

18. In a semiconductor device manufacturing method wherein the position of a wafer having an alignment mark is detected optically and, after adjustment of the position of the wafer, a circuit pattern is printed on the wafer, the improvement comprising the steps of:

illuminating the alignment mark with light from a super-luminescent diode to form a light image of the alignment mark with light reflected by the alignment mark; and detecting the position of the wafer on the basis of the formed light image.

19. A method according to claim 18, wherein the alignment mark has a zone plate pattern.

20. In a semiconductor device manufacturing method wherein the position of a wafer having an alignment mark is detected optically and, after adjustment of the position of the wafer, a circuit pattern is printed on the wafer, the improvement comprising the steps of:

illuminating the alignment mark with a multi-mode laser beam to form a light image of the alignment mark with light reflected by the alignment mark; and detecting the position of the wafer on the basis of the formed light image.

21. A method according to claim 20, wherein the alignment mark has a zone plate pattern.

22. A method according to claim 20, further comprising generating the laser beam by driving a single-mode semiconductor laser with a predetermined drive current to cause multi-mode laser oscillation.

23. In a semiconductor device manufacturing method usable with a mask having an alignment pattern and a circuit pattern and a wafer having an alignment mark and disposed close to the mask, wherein a positional deviation of the wafer with respect to the mask is detected and, after adjustment of the position of the wafer, the circuit pattern of the mask is printed on the wafer, the improvement comprising the steps of:

irradiating the alignment pattern of the mask and the alignment mark of the wafer with light having a center wavelength $\lambda$ and a half width of a wavelength spectrum which is between $\lambda^2/200000$ nm and 60 nm, to form first and second light images with light from the alignment pattern and the alignment mark; and detecting the positional deviation of the wafer on the basis of the formed first and second light images.

24. A method according to claim 23, wherein each of the alignment pattern and the alignment mark has a zone plate pattern.

25. A method according to claim 23, wherein the light irradiating the alignment pattern and the alignment mark is supplied from a super-luminescent diode.

26. A method according to claim 23, wherein said irradiating step comprises supplying light from a multi-mode oscillating laser.

27. In a semiconductor device manufacturing method usable with a mask having an alignment pattern with an optical power and a circuit pattern and a wafer having an alignment mark with an optical power and disposed close to the mask, wherein a positional deviation of the wafer with respect to the mask is detected and, after adjustment of the position of the wafer, the circuit pattern of the mask is printed on the wafer, the improvement comprising the steps of:

irradiating the alignment pattern of the mask and the alignment mark of the wafer with light having a center wavelength $\lambda$ and a half width of a wavelength spectrum which is between $\lambda^2/200000$ nm and 60 nm, to form a light image with light influenced by the optical powers of the alignment pattern and the alignment mark; and detecting the positional deviation of the wafer on the basis of the formed light image.

28. A method according to claim 27, wherein each of the alignment pattern and the alignment mark has a zone plate pattern.

29. A method according to claim 27, wherein said irradiating step comprises supplying light from a super-luminescent diode.

30. A method according to claim 27, wherein said irradiating step comprises supplying light from a multi-mode oscillating laser.

31. A proximity type exposure apparatus usable with a mask having a circuit pattern and an alignment pattern with an optical power and a wafer having an alignment mark with an optical power, for exposing the wafer to the circuit pattern of the mask with radiation, said apparatus comprising:

irradiating means for irradiating the alignment pattern of the mask and the alignment mark of the wafer with light having a center wavelength $\lambda$ and a half width of a wavelength spectrum which is between $\lambda^2/200000$ nm and 60 nm, to form a light image with light influenced by the optical powers of the alignment pattern and the alignment mark; and detecting means having a detection surface, for detecting the light image on the detection surface to produce a signal corresponding to a positional deviation between the mask and the wafer; and aligning means responsive to the signal from said detecting means to align the mask and the wafer with each other.

32. An apparatus according to claim 31, wherein said irradiating means comprises a super-luminescent diode for providing the irradiating light.

33. An apparatus according to claim 31, wherein said irradiating means comprises a multi-mode oscillating laser for providing the light.

34. A proximity type exposure apparatus usable with a mask having a circuit pattern and an alignment pattern and a wafer having an alignment mark, for exposing the wafer to the circuit pattern of the mask with radiation, said apparatus comprising:

irradiating means for irradiating the alignment pattern of the mask and the alignment mark of the wafer with light having a center wavelength $\lambda$ and a half width of a wavelength spectrum which is between $\lambda^2/200000$ nm and 60 nm, to form first and second light images with light from the alignment pattern and the alignment mark; and detecting means having a detection surface, for detecting the first and second light images on the detection surface to produce a signal corresponding to a positional deviation between the mask and the wafer; and aligning means responsive to the signal from said detecting means to bring the mask and the wafer into alignment with each other.

35. An apparatus according to claim 34, wherein said irradiating means comprises a super-luminescent diode for providing the irradiating light.

36. An apparatus according to claim 34, wherein said irradiating means comprises a multi-mode oscillating laser for providing the irradiating light.

* * * * *

UNITED STATES PATENT AND TRADEMARK OFFICE
CERTIFICATE OF CORRECTION

PATENT NO. : 5,155,370
DATED : October 13, 1992
INVENTOR(S) : Hiroshi Osawa, et al.

Page 1 of 2

It is certified that error appears in the above-identified patent and that said Letters Patent is hereby corrected as shown below:

IN THE DRAWINGS

In FIG. 6B, "HOLIZONTAL" should read --HORIZONTAL--.

COLUMN 5

Line 2, "+ $e^{i(\phi 2-\phi 2)}$)" should read --+$e^{i(\phi 2-\phi 1)}$)--;
Line 33, "can not" should read --cannot--; and
Line 67, "light 47" should read --light 47''--.

COLUMN 9

Line 66, "diode" " should read --diode."--.

COLUMN 10

Line 16, "in" should read --on--.

COLUMN 12

Line 38, "geometo-optically" should read --geometro-optically-- and "distance" should read --distance of--.

UNITED STATES PATENT AND TRADEMARK OFFICE
CERTIFICATE OF CORRECTION

PATENT NO. : 5,155,370
DATED : October 13, 1992
INVENTOR(S) : Hiroshi Osawa, et al.

It is certified that error appears in the above-identified patent and that said Letters Patent is hereby corrected as shown below:

COLUMN 14

Line 32, "the" should read --said--; and
    Line 39, "thereof," should read --thereon,--.

COLUMN 15

Line 8, "substrate," should read --substrates,--; and
    Line 24, "substrates" should read --substrate--.

Signed and Sealed this

Ninth Day of November, 1993

Attest:

BRUCE LEHMAN

Attesting Officer     Commissioner of Patents and Trademarks